US011710697B2

(12) United States Patent
Tak et al.

(10) Patent No.: US 11,710,697 B2
(45) Date of Patent: *Jul. 25, 2023

(54) SEMICONDUCTOR MEMORY DEVICE WITH 3D STRUCTURE

(71) Applicant: SK hynix Inc., Gyeonggi-do (KR)

(72) Inventors: Jung-Mi Tak, Seoul (KR); Sung-Lae Oh, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 556 days.

This patent is subject to a terminal disclaimer.

(21) Appl. No.: 16/716,929

(22) Filed: Dec. 17, 2019

(65) Prior Publication Data
US 2020/0126903 A1 Apr. 23, 2020

Related U.S. Application Data

(63) Continuation of application No. 15/352,765, filed on Nov. 16, 2016, now Pat. No. 10,546,814.

(30) Foreign Application Priority Data

Aug. 2, 2016 (KR) .................. 10-2016-0098284

(51) Int. Cl.
*H01L 23/528* (2006.01)
*H10B 43/40* (2023.01)
(Continued)

(52) U.S. Cl.
CPC ............ *H01L 23/528* (2013.01); *G11C 17/18* (2013.01); *H01L 23/5226* (2013.01);
(Continued)

(58) Field of Classification Search
CPC ... G11C 17/18; H01L 23/528; H01L 23/5226; H01L 23/5256; H01L 27/11524; H01L 27/11529; H01L 27/1157; H01L 27/11573; H01L 27/11582; H10B 41/35; H10B 41/41; H10B 43/35; H10B 43/40; H10B 43/27

See application file for complete search history.

(56) References Cited

U.S. PATENT DOCUMENTS 10,546,814 B2 * 1/2020 Tak ..................... H01L 27/1157
2009/0034336 A1 * 2/2009 Kwak ................ G11C 16/0483
365/185.17

(Continued)

FOREIGN PATENT DOCUMENTS

KR 10-2015-0106660 9/2015

OTHER PUBLICATIONS

Office Action issued by the Chinese Patent Office dated Jul. 7, 2020.

*Primary Examiner* — Sophia T Nguyen
*Assistant Examiner* — Scott E Bauman
(74) *Attorney, Agent, or Firm* — IP&T Group LLP

(57) ABSTRACT

A semiconductor memory device with a three-dimensional (3D) structure may include: a cell region arranged over a substrate, including a cell structure; a peripheral circuit region arranged between the substrate and the cell region; an upper wiring structure arranged over the cell region; main channel films and dummy channel films formed through the cell structure. The dummy channel films are suitable for electrically coupling the upper wiring structure.

7 Claims, 11 Drawing Sheets

(51) Int. Cl.
  *G11C 17/18* (2006.01)
  *H01L 23/522* (2006.01)
  *G11C 5/02* (2006.01)
  *G11C 5/06* (2006.01)
  *H10B 43/10* (2023.01)
  *H10B 43/27* (2023.01)
  *H01L 23/525* (2006.01)
  *H10B 41/35* (2023.01)
  *H10B 41/41* (2023.01)
  *H10B 43/35* (2023.01)
  *H10B 41/10* (2023.01)
  *H10B 41/27* (2023.01)

(52) U.S. Cl.
  CPC ......... *H01L 23/5256* (2013.01); *H10B 41/35* (2023.02); *H10B 41/41* (2023.02); *H10B 43/35* (2023.02); *H10B 43/40* (2023.02); *G11C 5/025* (2013.01); *G11C 5/063* (2013.01); *G11C 5/066* (2013.01); *H10B 41/10* (2023.02); *H10B 41/27* (2023.02); *H10B 43/10* (2023.02); *H10B 43/27* (2023.02)

(56) References Cited

U.S. PATENT DOCUMENTS

| | | | |
|---|---|---|---|
| 2011/0013454 A1* | 1/2011 | Hishida | G11C 16/0483 365/185.11 |
| 2015/0041901 A1* | 2/2015 | Son | H01L 27/1157 257/368 |
| 2015/0129878 A1* | 5/2015 | Shin | H01L 27/11526 257/329 |
| 2015/0372005 A1 | 12/2015 | Yon et al. | |
| 2016/0163732 A1* | 6/2016 | Lim | H10B 43/40 257/314 |
| 2017/0221813 A1* | 8/2017 | Kim | H01L 28/00 |

* cited by examiner

SEMICONDUCTOR MEMORY DEVICE WITH 3D STRUCTURE

CROSS-REFERENCE TO RELATED APPLICATIONS

This application is a continuation of U.S. patent application Ser. No. 15/352,765 filed on Nov. 16, 2016, which issued as U.S. Pat. No. 10,546,814, and claims the benefits of priority of Korean Patent Application Number 10-2016-0098284, filed on Aug. 2, 2016. The disclosure of each of the foregoing applications is incorporated herein by reference in their entirety.

BACKGROUND

1. Field

Exemplary embodiments of the present invention relate to a semiconductor device and, more particularly, to a semiconductor memory device with a three-dimensional (3D) structure.

2. Description of the Related Art

Due to the continuing advances of the electronic industries semiconductor memory devices with improved performance and lower cost are needed. To meet these requirements, 3D semiconductor memory devices in which memory cells are arranged in a plurality of cell strings in a three-dimensional structure have been proposed. 3D semiconductor memory devices provide substantial improvements in the integration density of semiconductor memory devices. Recently, a variety of techniques have been developed to improve the characteristics and integration density of such a 3D semiconductor memory device. However, further improvements are needed.

SUMMARY

The present invention is directed to an improved three-dimensional semiconductor memory device and a method for manufacturing such device.

In an embodiment, a semiconductor memory device with a three-dimensional (3D) structure may include: a cell region arranged over a substrate, including a cell structure; a peripheral circuit region arranged between the substrate and the cell region; an upper wiring structure arranged over the cell region; main channel films and dummy channel films formed through the cell structure, wherein the dummy channel films are suitable for electrically coupling the upper wiring structure.

In an embodiment, a semiconductor memory device with a three-dimensional (3D) structure may include: a cell region arranged over a substrate, including a cell structure; a peripheral circuit region disposed between the substrate and the cell region; main channel films formed through the cell structure; first and second dummy channel films electrically coupled to the peripheral circuit region through the cell structure; and a fuse disposed over the cell region and coupled between the first and second dummy channel films.

BRIEF DESCRIPTION OF THE DRAWINGS

The above and other features and advantages of the present invention will become apparent to those skilled in the relevant art by the following detailed description with reference to the attached drawings in which.

DETAILED DESCRIPTION

Figure 1:
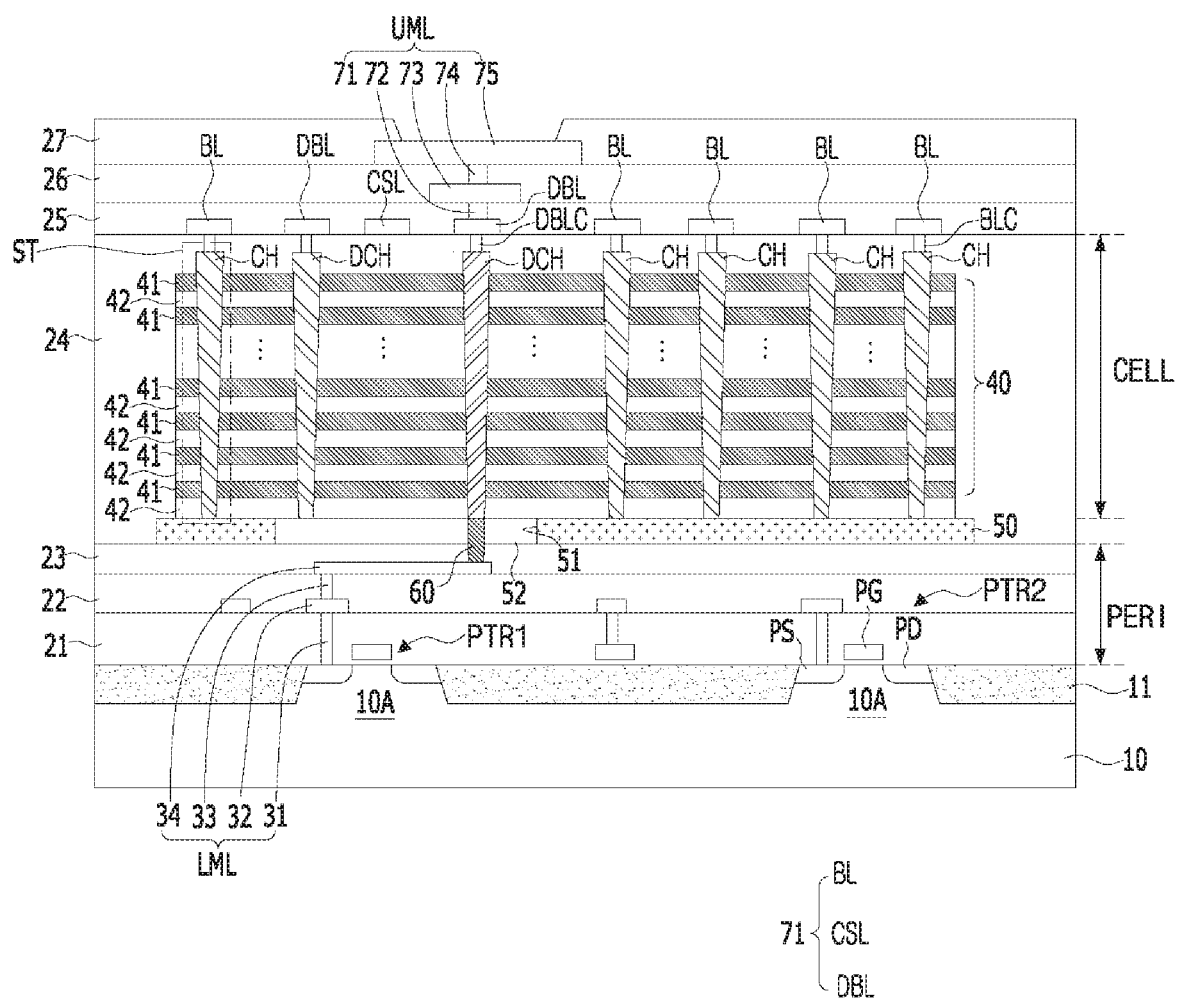
FIG. 1 is a cross-sectional view of a semiconductor memory device with a three-dimensional (3D) structure according to an embodiment of the present invention.

Hereafter, various embodiments will be described below in more detail with reference to the accompanying drawings, such that the present invention can be practiced by those skilled in the art to which the present invention pertains. The drawings are not necessarily illustrated at a constant ratio, and at least a part of the structures illustrated in the drawings may be exaggerated in order to clarify the characteristics of embodiments. The drawings or detailed descriptions of a multilayer structure may not reflect all layers existing in a specific multilayer structure. For example, one or more additional layers may exist between two layers. For example, when a first layer is being referred to as being formed on a second layer or substrate in a multilayer structure of the drawings or detailed description, it may not only indicate that the first layer can be directly formed on the second layer or the substrate, but also indicate that one or more other layers exist between the first and second layers or between the first layer and the substrate.

When different embodiments are described, any repetitive descriptions of the same components will be omitted, and the same components are denoted by like reference numerals.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Figure 2:
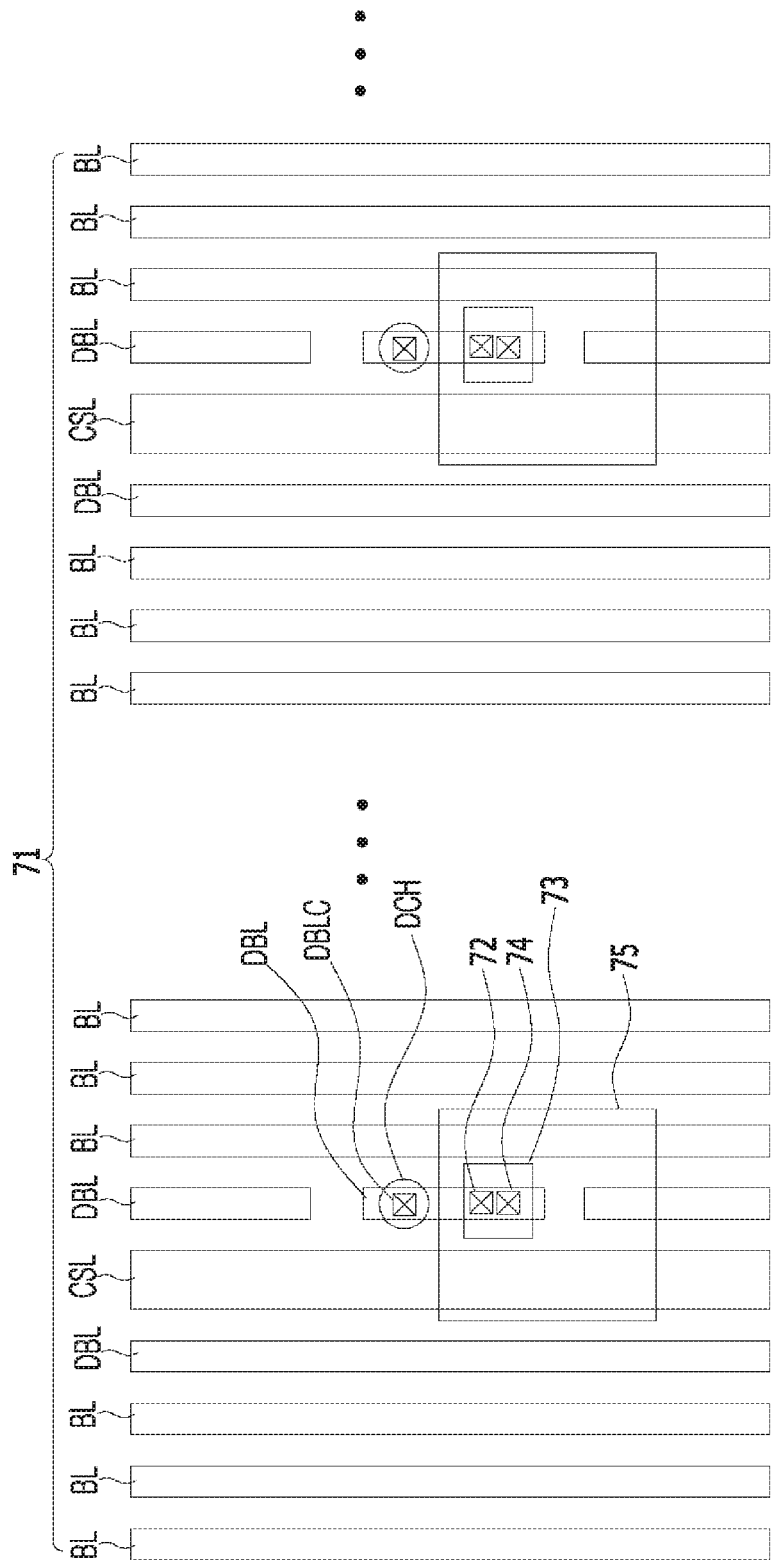
FIG. 2 is a plan view of dummy channel films, dummy bit line contacts and an upper wiring structure, which are illustrated in FIG. 1.

Referring to FIGS. 1 and 2, a cell region CELL is formed over a substrate 10, and a peripheral circuit region PERI is formed between the cell region CELL and the substrate 10.

The substrate 10 may include one of a silicon (Si) substrate, a germanium (Ge) substrate, a silicon-germanium (SiGe) substrate, a Silicon-On-Insulator (SOI) substrate or a Silicon-Germanium-Insulator (SGOI) substrate. An isolation layer 11 may be formed at an upper region of substrate 10 partially covering the substrate and defining an active region 10A.

The cell region CELL may include a plurality of memory cells arranged therein. The peripheral circuit region PERI may include one or more peripheral circuits arranged therein.

The peripheral circuit region PERI may vertically overlap the cell region CELL at the bottom of the cell region CELL. Since the peripheral circuit region PERI overlaps the cell region CELL, the size of the semiconductor memory device is reduced because utilization of the area of the substrate 10 is increased.

The peripheral circuits arranged in the peripheral circuit region PERI may include a data processing circuit capable of processing data inputted to or outputted from the memory cells arranged in the cell region CELL. The peripheral circuits may include a test logic circuit capable of testing whether the semiconductor memory device is normally operated. For example, the data processing circuit may include a row decoder, a page buffer, an input/output buffer, a control logic, a voltage generator and the like. The test logic circuit may be used to test whether the semiconductor memory device is normally operated, at the final step of the process for fabricating the semiconductor memory device.

In the illustrated embodiment, the peripheral circuit region PERI may include peripheral circuit elements PRT1 and PTR2 constituting the peripheral circuits and a lower wiring structure LML electrically coupled to the peripheral circuit elements PTR1 and PRT2. The peripheral circuit elements PTR1 and PTR2 may include peripheral transistors. Each of the transistors may include a gate PG and impurity regions PS and PD. The gate PG may be formed over the substrate 10. The impurity regions PS and PD may be formed in an active region 10A defined by the isolation layer 11 at both sides of the gate PG, and serve as a source and drain, respectively.

Over the substrate 10, interlayer insulation films (or layers) 21, 22 and 23 are formed to cover the peripheral circuit elements PTR1 and PTR2 and the lower wiring structure LWL. The interlayer insulation films 21, 22, and 23 may be sequentially stacked. The first to third interlayer insulation films 21, 22, and 23 may include silicon oxide, silicon oxynitride and the like.

The lower wiring structure LML may be formed in the first to third interlayer insulation films 21, 22, and 23. The lower wiring structure LML may include a first lower wiring contact 31, a first lower wiring layer 32, a second lower wiring contact 33 and a second lower wiring layer 34. The first lower wiring layer 32 may be formed on the first interlayer insulation film 21, and may be electrically coupled to the peripheral circuit elements PTR1 and PTR2 through the first lower wiring contact 31. More specifically, the first lower wiring contact 31 may be an elongated element which extends substantially vertically through the first interlayer insulation film 21 to couple the first lower wiring layer 31 with the peripheral circuit elements PTR1 and PTR2. The second lower wiring layer 34 may be formed on the second interlayer insulation film 22, and may be electrically coupled to the first lower wiring layer 32 through the second lower wiring contact 33. The second lower wiring contact 33 may be an elongated element extending vertically within the second interlayer insulation film to connect the second lower wiring layer 34 with the first lower wiring layer 31.

The peripheral circuit elements PTR1 and PTR2 may include high-voltage transistors for transmitting a high voltage. Thus, when the semiconductor memory device is operated, the peripheral circuit elements PTR1 and PTR2 may generate a large amount of heat. Since the lower wiring structure LML is disposed close to the peripheral circuit elements PTR1 and PTR2, the lower wiring structure LML may be formed of a metal which has a high fusing point to withstand the heat generated from the peripheral circuit elements PTR1 and PTR2. For example, the lower wiring structure LML may be made of a metal such as tungsten, molybdenum, titanium, cobalt, tantalum or nickel.

In the present embodiment, the lower wiring structure LML has a structure in which two lower wiring layers 32 and 34 are coupled by two lower wiring contacts 31 and 33. However, depending on the layout of the peripheral circuit elements formed in the peripheral circuit region PERI and the type and arrangement of the peripheral circuit elements, the lower wiring structure LML may have a structure in which one or more lower wiring layers are coupled by one or more lower wiring contacts.

The cell region CELL may have a cell structure 40 formed therein. The cell structure 40 may include a plurality of cell gate conductive films 41 and a plurality of insulation films 42. The plurality of cell gate conductive films 41 may be spaced apart from each other at a regular interval in the vertical direction, and the plurality of insulation films 42 formed between the respective gate insulation films 42 for insulating the respective cell gate conductive films 41 from each other.

The cell gate conductive films 41 may include a metal such as tungsten, nickel, cobalt or tantalum, impurity-doped polysilicon, a metal silicide such as tungsten silicide, nickel silicide, cobalt silicide or tantalum silicide, or combinations thereof. The insulation films 42 may include silicon oxide, silicon nitride, silicon oxynitride and the like.

Among the cell gate conductive films 41, one or more layers from the lowermost layer may be used as a select line of a source select transistor, one or more layers from the uppermost layer may be used as a select line of a drain select transistor. The conductive films between the select lines may be used as word lines, with each word line being operatively coupled to a plurality of memory cells.

The cell region CELL may include main channel films CH formed through the cell structure 40 in a direction perpendicular to the top surface of the substrate 10. The main channel films CH may include impurity-doped polysilicon or undoped polysilicon.

The main channel films CH may be buried in through-holes formed in the cell structure 40 to completely fill the through-holes. In an embodiment (not shown) Although not illustrated, in an embodiment, each of the main channel films CH may be formed in a tube shape surrounding an insulation film which fills the central region of the corresponding through-hole, along the sidewall of the through-hole passing through the cell structure 40. The main channel films CH may have a structure including one of the burial-type structure and the tube-type structure.

The select transistors may be formed at the respective intersections between the select lines and the main channel films CH. The memory cells may be formed at the respective intersections between the word lines and the main channel films CH. In such a structure, the select transistors and the memory cells may be coupled in series by the main channel films CH, and constitute cell strings ST.

Between the main channel films CH and the cell structure 40, a gate insulation film (not illustrated) may be formed to cover the outer walls of the main channel films CH. The gate insulation film may include a tunnel insulation film, a charge storing film and a blocking insulation film, which are sequentially stacked therein. The tunnel insulation film may include silicon oxide, hafnium oxide, aluminum oxide, zirconium oxide, tantalum oxide and the like. The charge storing film may include silicon nitride, boron nitride, silicon boron nitride or impurity-doped polysilicon. The blocking insulation film may include a single-layer or multilayer structure of silicon oxide, silicon nitride, hafnium oxide, aluminum oxide, zirconium oxide and tantalum oxide.

Between the cell region CELL and the peripheral circuit region PERI, a semiconductor pattern 50 may be formed. The semiconductor pattern 50 may overlap the cell structure 40 except for an area of the cell structure 40 that includes dummy channel films DCH. More specifically, the semiconductor pattern 50 may define an opening 51 below an area of the cell structure 40 that includes the dummy channel films DCH.

The semiconductor pattern 50 may serve as a common source region which is electrically coupled to the main channel films CH and supplies a common source voltage to the cell strings ST. The semiconductor pattern 50 may be formed by doping an impurity-doped semiconductor or undoped intrinsic semiconductor with p-type or n-type impurities, the impurity including a group III element, group IV element and/or group V element. The semiconductor pattern 50 may include a pipe gate electrode. Such an embodiment will be clarified through the following descriptions with reference to FIG. 9.

Over the third interlayer insulation film 23, interlayer insulation films 24 to 26 may be formed to cover the semiconductor pattern 50 and the cell structure 40. The interlayer insulation films 24 to 26 may include fourth to sixth interlayer insulation films 24 to 26 which are sequentially stacked. The fourth to sixth interlayer insulation films 24 to 26 may include silicon oxide and silicon oxynitride.

An upper wiring structure UML may include a first upper wiring layer 71, a first upper wiring contact 72, a second upper wiring layer 73, a second upper wiring contact 74 and an external connection pad 75. In the embodiment of FIG. 1, one first upper wiring contact 72, one second upper wiring layer 73, one second upper wiring contact 74 and one external connection pad 75 are formed. However, two or more first upper wiring contacts 72, two or more second upper wiring layers 73, two or more second upper wiring contacts 74 and two or more external connection pads 75 may be formed.

The first upper wiring layer 71 may be formed on the fourth interlayer insulation film 24, and include bit lines BL, common source lines CSL and dummy bit lines DBL.

The bit lines BL may be electrically coupled to the main channel films CH through bit line contacts BLC formed through the fourth interlayer insulation film 24. The common source line CSL may serve to transmit a common source voltage to the semiconductor pattern 50 used as the common source region. Although not illustrated, in an embodiment, the common source line CSL may be electrically coupled to the semiconductor pattern 50 through a contact plug formed through the fourth interlayer insulation film 24.

In order to prevent a reduction of the breakdown voltage (BV) characteristic due to potential differences between the common source lines CSL and the bit lines BL, the dummy bit lines DBL may be arranged between the common source lines CSL and the bit lines BL. The second upper wiring layer 73 may be formed on the fifth interlayer insulation film 25, and may be electrically coupled to the dummy bit lines DBL through the first upper wiring contact 72. The first upper wiring contact 72 may be an elongated element extending substantially vertically inside the fifth interlayer insulation layer 25 to connect the second upper wiring layer 73 with the first upper wiring layer 71.

The external connection pad 75 may be formed on the sixth interlayer insulation film 26, and may be electrically coupled to the second upper wiring layer 73 through the second upper wiring contact 74. The second upper wiring contact 74 may be an elongated element extending vertically inside the sixth interlayer insulation film 26 to electrically connect the external connection pad 75 with the second upper wiring layer 73. The external connection pad 75 may serve as an external contact point of the semiconductor memory device, which is used for electrical connection with an external device, and overlap the cell structure 40. A passivation film 27 exposing the external connection pad 75 may be formed on the sixth interlayer insulation film 26.

The upper wiring structure UML may be formed of a conductive material having a low surface resistance. The conductive material forming the upper wiring structure UML may have lower surface resistance than a conductive material forming the lower wiring structure LML. For example, the upper wiring structure UML may be formed of a metal such as aluminum (Al), copper (Cu), silver (Ag) or gold (Au).

In the present embodiment, the upper wiring structure UML has two upper wiring layers 71 and 73. However, the upper wiring structure UML may include one, three or more upper wiring layers.

Under the dummy bit line DBL, dummy channel films DCH may be formed through the cell structure 40 in a direction perpendicular to the top surface of the substrate 10. Each of the dummy channel films DCH may overlap any one of the dummy bit lines DBL.

The dummy channel films DCH may be formed at the same time as the main channel films CH are formed. The dummy channel films DCH may have substantially the same structure as the main channel films CH.

The dummy channel films DCH may be buried in through-holes formed in the cell structure 40 to fill the through-holes. Although not illustrated, in an embodiment, each of the dummy channel films DCH may be formed in a tube shape surrounding an insulation film which fills the central region of the corresponding through-hole, along the sidewall of the through-hole passing through the cell structure 40. The dummy channel films DCH may have a structure including one of the burial-type structure and the tube-type structure.

Between the dummy channel films DCH and the cell structure 40, a gate insulation film (not illustrated) may be interposed to cover the outer walls of the dummy channel films DCH. The gate insulation film may include a tunnel insulation film, a charge storing film and a blocking insulation film, which are sequentially stacked. The tunnel insulation film may include silicon oxide, hafnium oxide, aluminum oxide, zirconium oxide, tantalum oxide and the like. The charge storing film may include silicon nitride, boron nitride, silicon boron nitride or impurity-doped polysilicon. The blocking insulation film may include a single-layer or multilayer structure of silicon oxide, silicon nitride, hafnium oxide, aluminum oxide, zirconium oxide and tantalum oxide.

The dummy bit lines DBL may be electrically coupled to the dummy channel films DCH through dummy bit line contacts DBLC formed through the fourth interlayer insulation film 24.

The semiconductor pattern 50 may include an opening 51 overlapping the dummy channel films DCH. The opening 51 may be filled with an insulating gap-fill layer 52. The insulating gap-fill layer 52 may include silicon oxide. Between the dummy channel films DCH and the lower wiring structure LML, vertical contacts 60 may be formed to electrically couple the dummy channel films DCH and the lower wiring structure LML through the insulating gap-fill layer 52 and the third interlayer insulation film 23. Each of the vertical contacts 60 may overlap any one of the dummy channel films DCH. More specifically, each vertical contact 60 may be an elongated element having a top surface that has substantially the same cross section as the bottom surface of the corresponding dummy channel film DCH. Each vertical contact 60 may be tapered having a bottom surface with a cross-sectional area that is smaller than the cross-sectional area of the top surface of the vertical contact 60 that abuts the bottom surface of the corresponding dummy channel film DCH.

The vertical contacts 60 may be formed of a metal such as tungsten, molybdenum, titanium, cobalt, tantalum or nickel, a metal silicide such as tungsten silicide, titanium silicide, nickel silicide, cobalt silicide or tantalum silicide, or combinations thereof.

The external connection pad 75 may be electrically coupled to the peripheral circuit region PERI through the upper wiring structure UML, the dummy bit line contacts DBLC, the dummy channel films DCH and the vertical contact 60.

For example, the external connection pad 75 may be electrically coupled to the data processing circuit formed in the peripheral circuit region PERI. In this case, the external connection pad 75 may correspond to an external input/output (I/O) pad serving as an external interface between the semiconductor memory device and an external device. The external connection pad 75 may be electrically coupled to the test logic circuit formed in the peripheral circuit region PERI. In this case, the external connection pad 75 may serve as a test pad configured to perform a test of the semiconductor memory device.

The external connection pad 75 may be electrically coupled to the peripheral circuit region PERI through the dummy channel films DCH formed through the cell structure 40. Thus, a routing path which electrically couples the external connection pad 75 and the peripheral circuit region PERI can be shortened to a smaller length than when the routing path is formed to bypass the cell structure 40.

When the routing path is lengthened, the capacitance and resistance may be increased. Then, while the influence of noise increases, a signal may be distorted during a signal transmission process, thereby reducing signal integrity. According to the present embodiment, since the routing path between the external connection pad 75 and the peripheral circuit region PERI can be shortened, the signal integrity can be improved.

Furthermore, the external connection pad 75 and the peripheral circuit region PERI are electrically coupled through the dummy channel films DCH overlapped by the dummy bit lines DBL which are formed to prevent a reduction of BV characteristic due to a potential difference between the common source lines CSL and the bit lines BL. Thus, the cell region CELL requires no additional area for electrically coupling the external connection pad 75 and the peripheral circuit region PERI. Therefore, an additional area for memory cells can be secured, thereby contributing to improving the integration density of the semiconductor memory device.

FIGS. 1 and 2 illustrate that a plurality of external connection pads 75 are electrically coupled to the peripheral circuit region PERI through the plurality of dummy channel films DCH and the plurality of vertical contacts 60. However, one or more external connection pads may be electrically coupled to the peripheral circuits through one or more dummy channel films and one or more vertical contacts.

FIGS. 1 and 2 illustrate that the plurality of main channel films CH are formed in the cell structure 40. However, the cell structure 40 may include one or more main channel layers formed therein.

FIGS. 1 and 2 illustrate that the dummy channel films DCH are used to electrically couple the peripheral circuit region PERI positioned under the cell region CELL to the external connection pad 75 positioned above the cell region CELL. However, the dummy channel films DCH may be used to electrically couple the peripheral circuit elements PTR1 and PTR2 formed in the peripheral circuit region PERI. These embodiments will be clarified through the following descriptions with reference to FIGS. 3 and 8.

Figure 3:
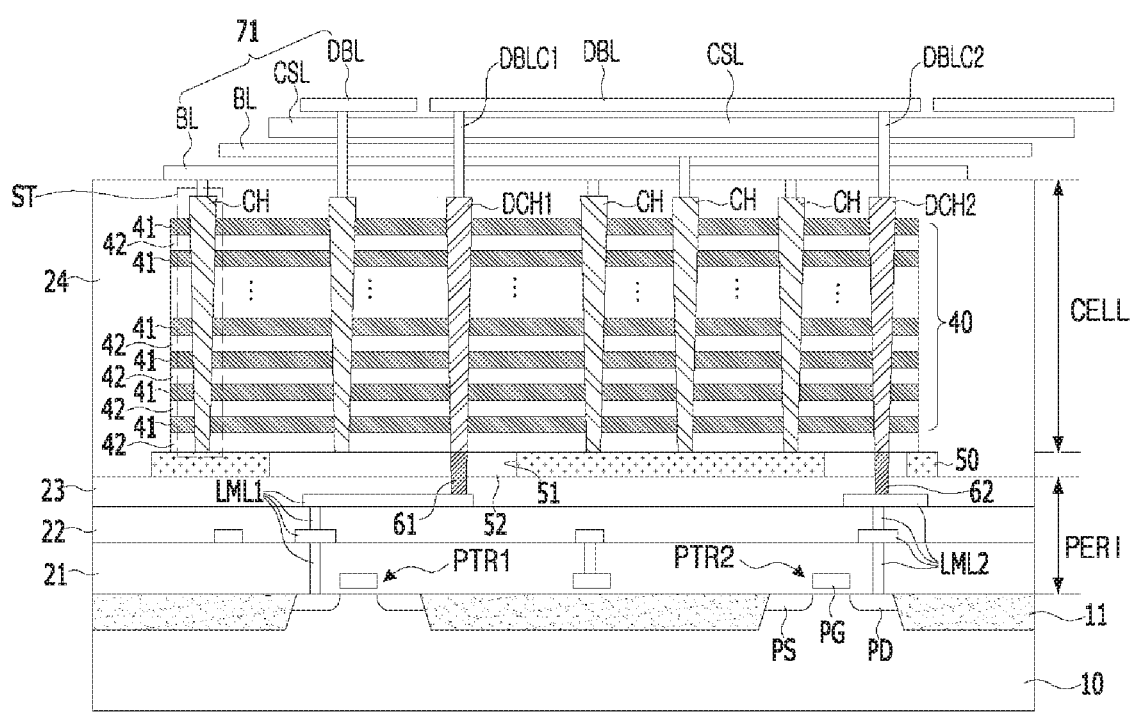
FIG. 3 is a cross-sectional view of a semiconductor memory device with a three-dimensional (3D) structure according to an embodiment of the present invention.
Figure 4:
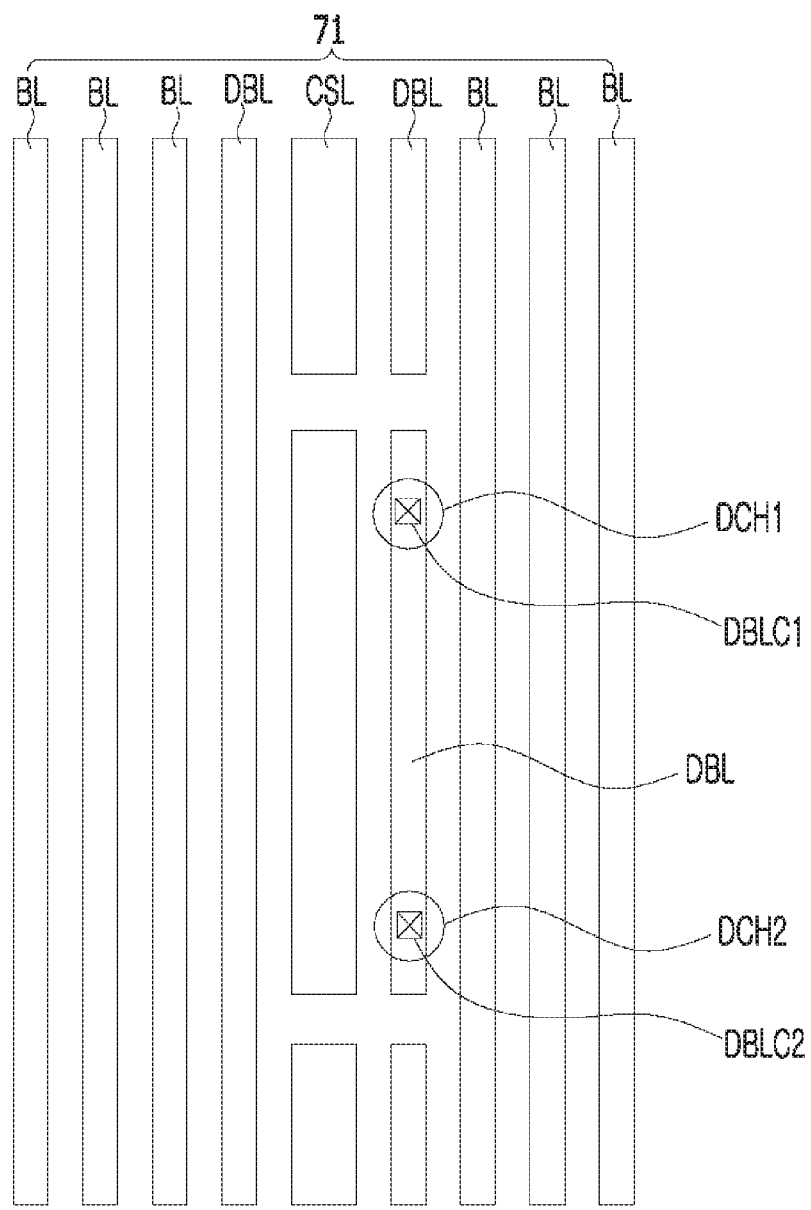
FIG. 4 is a plan view of dummy channel films, dummy bit line contacts and a first upper wiring layer, which are illustrated in FIG. 3.

Referring to FIGS. 3 and 4, a plurality of peripheral circuit elements PTR1 and PTR2 may be formed in the peripheral circuit region PERI. The peripheral circuit elements PTR1 and PTR2 may include a first peripheral circuit element PTR1 and a second peripheral circuit element PTR2 configured to receive a signal outputted from the first peripheral circuit element PTR1.

Dummy channel films DCH1 and DCH2 may be formed under any one of the dummy bit lines DBL to pass through the cell structure 40 in a direction perpendicular to the top surface of the substrate 10. The dummy channel films DCH1 and DCH2 may overlap any one of the dummy bit lines DBL.

The dummy channel films DCH1 and DCH2 may include a first dummy channel film DCH1 and a second dummy channel film DCH2. The first dummy channel film DCH1 may be electrically coupled to the first peripheral circuit element PTR1 through a vertical contact 61 and a lower wiring structure LML1. The second dummy channel film DCH2 may be electrically coupled to the second peripheral circuit element PTR2 through a vertical contact 62 and a lower wiring structure LML2.

The first dummy channel film DCH1 may be electrically coupled to one end of any one of the dummy bit lines DBL through a first dummy bit line contact DBLC1, and the second dummy channel film DCH2 may be electrically coupled to the other end of the same dummy bit line DBL through a second dummy bit line contact DBLC2.

The first and second peripheral circuit elements PTR1 and PTR2 may be spaced apart at a considerable distance from each other along the direction of the bit lines BL. Thus, in order to electrically couple the first and second peripheral circuit elements PTR1 and PTR2, a long routing path extending in the direction of the bit line BL is required.

As described above, the conductive material forming the lower wiring structure has a high resistance value. Therefore, when the first and second peripheral circuit elements PTR1 and PTR2 are connected through the lower wiring structure even though the first and second peripheral circuit elements PTR1 and PTR2 are spaced a considerable distance from each other, the influence of noise may be increased by the high resistance value of the lower wiring structure. Thus, while a signal is distorted during a signal transmission process, the integrity of the signal provided to the second peripheral circuit element PTR2 may be significantly degraded.

In the present embodiment, the length of each of the lower wiring structures LML1 and LML2 is reduced whereas the dummy bit line of the upper wiring structure which is made of a material having a lower resistance value than the lower wiring structures LML1 and LML2 is formed to a length required for connecting the first and second dummy channel films DCH1 and DCH2. More specifically, the lower wiring structures LML1 and LML2 are each formed to a sufficient length connect the first and second peripheral circuit elements PTR1 and PTR2 to the first and second dummy channel films DCH1 and DCH2, respectively, whereas the dummy bit line of the upper wiring structure which is made of a material having a lower resistance value than the lower wiring structures LML1 and LML2 is formed to a sufficient length that connects the first and second dummy channel films DCH1 and DCH2. Thus, the resistance of the routing path connecting the first and second peripheral circuit elements PTR1 and PTR2 can be lowered, and the distortion of a signal from the first peripheral circuit element PTR1 while transmitted to the second peripheral circuit element PTR2 can be minimized, which makes it possible to improve the integrity of the signal provided to the second peripheral circuit element PTR2.

Furthermore, since the lower wiring structures LML1 and LML2 and the dummy bit line DBL are connected through the dummy channel films DCH1 and DCH2 formed through the cell structure 40, the routing path for electrically coupling the lower wiring structures LML1 and LML2 and the dummy bit line DBL can be shortened to a smaller length than when the routing path is formed to bypass the cell structure 40. As a result, since the routing path between the first and second peripheral circuit elements PTR1 and PTR2 can be shortened, the distortion of a signal from the first peripheral circuit element PTR1 while transmitted to the second peripheral circuit element PTR2 can be minimized, which makes it possible to improve the integrity of the signal provided to the second peripheral circuit element PTR2.

FIGS. 3 and 4 illustrate that the first and second peripheral circuit elements PTR1 and PTR2 are spaced from each other along the direction of the bit lines BL, and the first and second peripheral circuit elements PTR1 and PTR2 are electrically coupled through the dummy bit line DBL.

However, the first and second peripheral circuit elements PTR1 and PTR2 may be spaced from each other along a direction perpendicular to the bit lines BL, and the first and second peripheral circuit elements PTR1 and PTR2 may be electrically coupled through the second upper wiring layer 73 extended in the direction perpendicular to the bit lines BL. Such an embodiment will be clarified through the following descriptions with reference to FIGS. 5 and 6.

Figure 5:
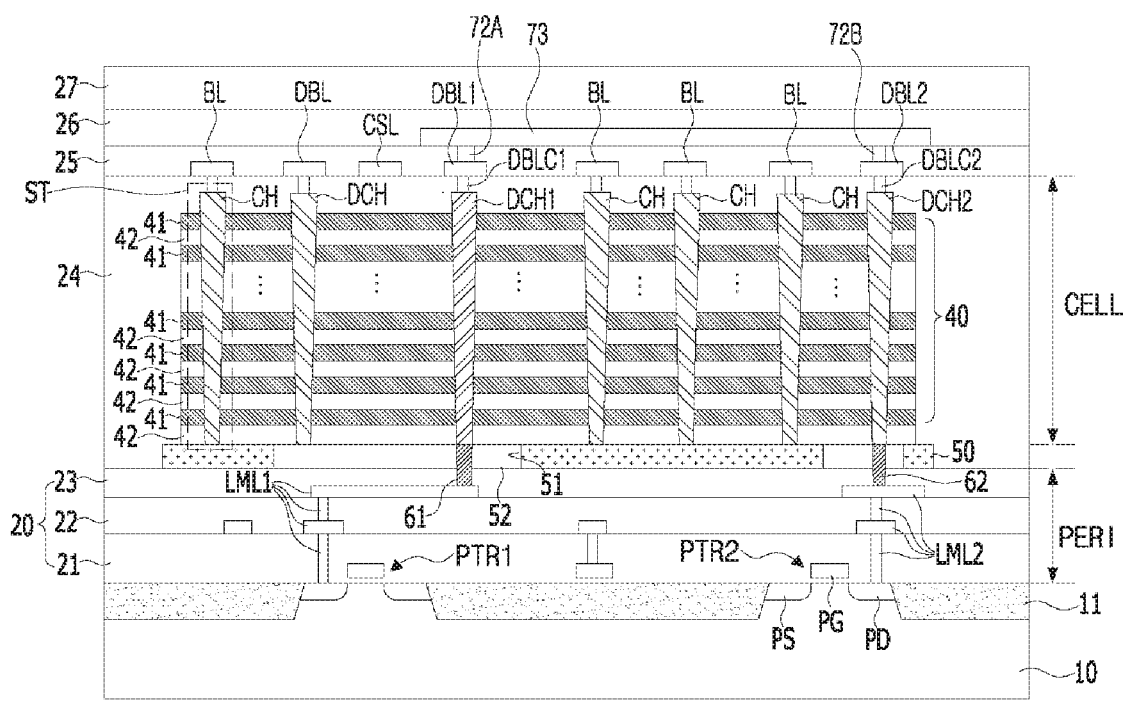
FIG. 5 is a cross-sectional view of a semiconductor memory device with a three-dimensional (3D) structure according to an embodiment of the present invention.
Figure 6:
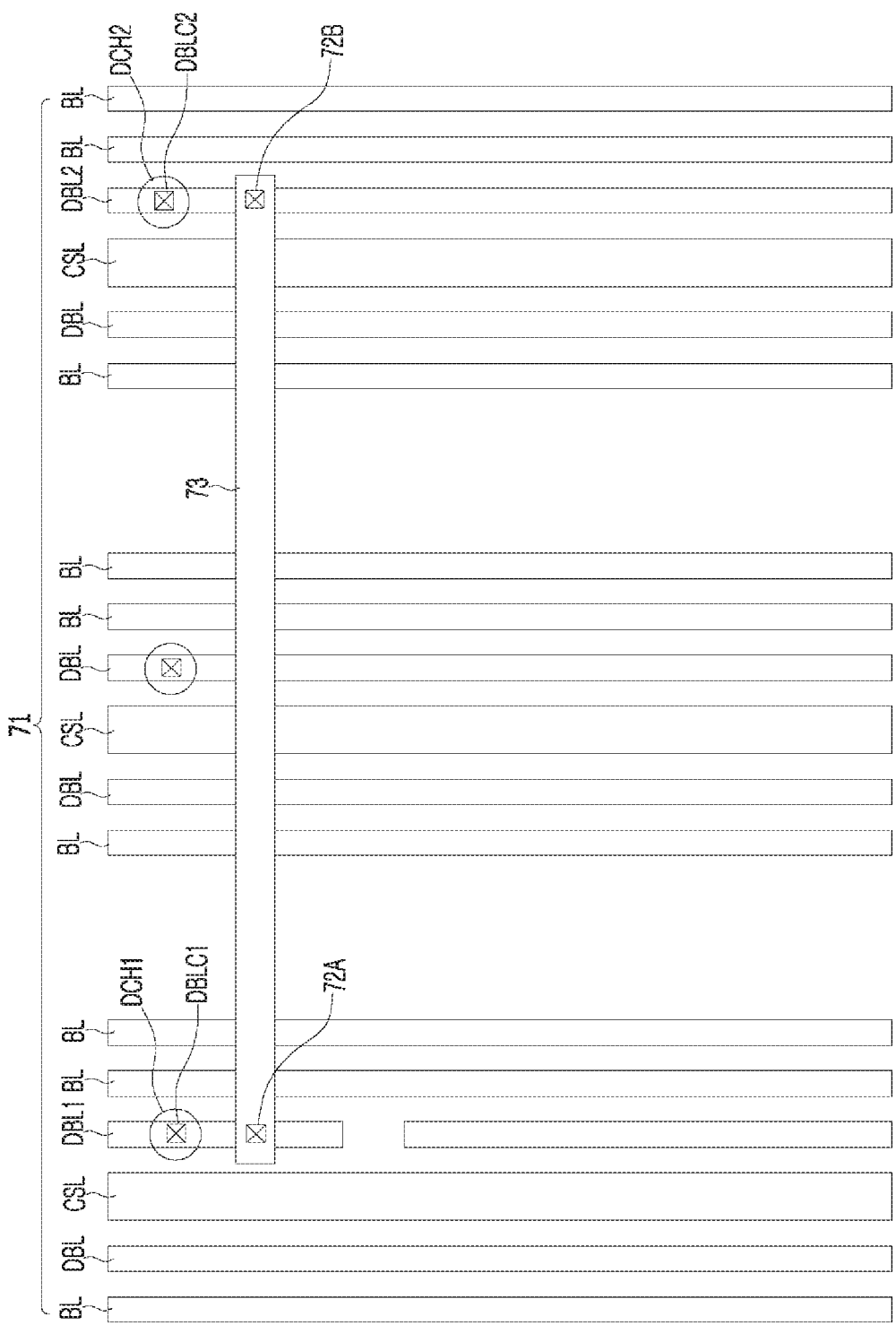
FIG. 6 is a plan view of dummy channel films, dummy bit line contacts, a first upper wiring layer, first upper wiring contacts and a second upper wiring layer, which are illustrated in FIG. 5.

Referring to FIGS. 5 and 6, a plurality of peripheral circuit elements PTR1 and PTR2 may be formed in the peripheral circuit region PERI. The peripheral circuit elements PTR1 and PTR2 may include a first peripheral circuit element PTR1 and a second peripheral circuit element PTR2 configured to receive a signal outputted from the first peripheral circuit element PTR1.

The first and second peripheral circuit elements PTR1 and PTR2 may be spaced apart at a considerable distance from each other in a direction perpendicular to the bit lines BL.

Dummy channel films DCH1 and DCH2 may be formed under dummy bit lines DBL1 and DBL2 to pass through the cell structure 40 in a direction perpendicular to the top surface of the substrate 10. The dummy channel films DCH1 and DCH2 may overlap the first and second dummy bit lines DBL1 and DBL2, respectively.

The dummy channel films DCH1 and DCH2 may include a first dummy channel film DCH1 and a second dummy channel film DCH2. The first dummy channel film DCH1 may be electrically coupled to the first peripheral circuit element PTR1 through a vertical contact 61 and a lower wiring structure LML1. The second dummy channel film DCH2 may be electrically coupled to the second peripheral circuit element PTR2 through a vertical contact 62 and a lower wiring structure LML2.

The first dummy channel film DCH1 may be electrically coupled to the first dummy bit line DBL1 through a first dummy bit line contact DBLC1. The second dummy channel film DCH2 may be electrically coupled to the second dummy bit line DBL2 through a second dummy bit line contact DBLC2.

The second upper wiring layer 73 may be extended in a direction perpendicular to the bit lines BL and the first and second dummy bit lines DBL1 and DBL2. One end of the second upper wiring layer 73 may be electrically coupled to the first dummy bit line DBL1 through a first upper wiring contact 72A, and the other end may be electrically coupled to the second dummy bit line DBL2 through a second upper wiring contact 72I3.

Therefore, the first peripheral circuit element PTR1 may be electrically coupled to the second peripheral circuit element PTR2 through the lower wiring structure LML1, the vertical contact 61, the first dummy channel film DCH1, the first dummy bit line contact DBLC1, the first dummy bit line DBL1, the first upper wiring contact 72A, the second upper wiring layer 73, the second upper wiring contact 72I3, the second dummy bit line DBL2, the second dummy bit line contact DBLC2, the second dummy channel film DCH2, the vertical contact 62 and the lower wiring structure LML2.

As described above, the conductive material forming the lower wiring structures LML1 and LML2 has a high resistance value. Therefore, when the first and second peripheral circuit elements PTR1 and PTR2 are coupled through the lower wiring structure even though the first and second peripheral circuit elements PTR1 and PTR2 are spaced a considerable distance from each other, the influence of noise may be increased by the high resistance value of the lower wiring structure. Thus, while a signal is distorted during a signal transmission process, the integrity of the signal provided to the second peripheral circuit element PTR2 may be degraded.

In the present embodiment, the lower wiring structures LML1 and LML2 are formed to such small lengths that connect the first and second peripheral circuit elements PTR1 and PTR2 to the first and second dummy channel films DCH1 and DCH2, respectively. Further, the second upper wiring layer 73 made of a material having a lower resistance value than the lower wiring structures LML1 and LML2 is formed to a large length. Thus, since the resistance of a routing path connecting the first and second peripheral circuit elements PTR1 and PTR2 can be lowered, the integrity of the signal provided to the second peripheral circuit element PTR2 can be improved.

Furthermore, since the lower wiring structures LML1 and LML2 and the second upper wiring layer 73 are electrically coupled to each other through the dummy channel films DCH1 and DCH2 formed through the cell structure 40, the routing path for electrically coupling the lower wiring structures LML1 and LML2 and the second upper wiring layer 73 can be shortened to a smaller length than when the routing path is formed to bypass the cell structure 40. Thus, since the routing path between the first and second peripheral circuit elements PTR1 and PTR2 is shortened, the distortion of a signal from the first peripheral circuit element PTR1 while transmitted to the second peripheral circuit element PTR2 can be minimized, which makes it possible to improve the integrity of the signal provided to the second peripheral circuit element PTR2.

In the embodiments of FIGS. 3 to 6, the dummy bit line DBL or the second upper wiring layer 73 is used as a routing path for transmitting a signal. However, the dummy bit line DBL or the second upper wiring layer 73 may be used as a fuse. Such an embodiment will be clarified through the following descriptions with reference to FIGS. 7 and 8.

A semiconductor memory device may have an internal option which is determined according to the characteristic of a product to which the semiconductor memory device is applied, and operate according to each application program. A fuse may store such option information. The option information may be stored by electrically cutting the fuse. Furthermore, the fuse may further store repair information for a repair operation of the semiconductor memory device.

Figure 7:
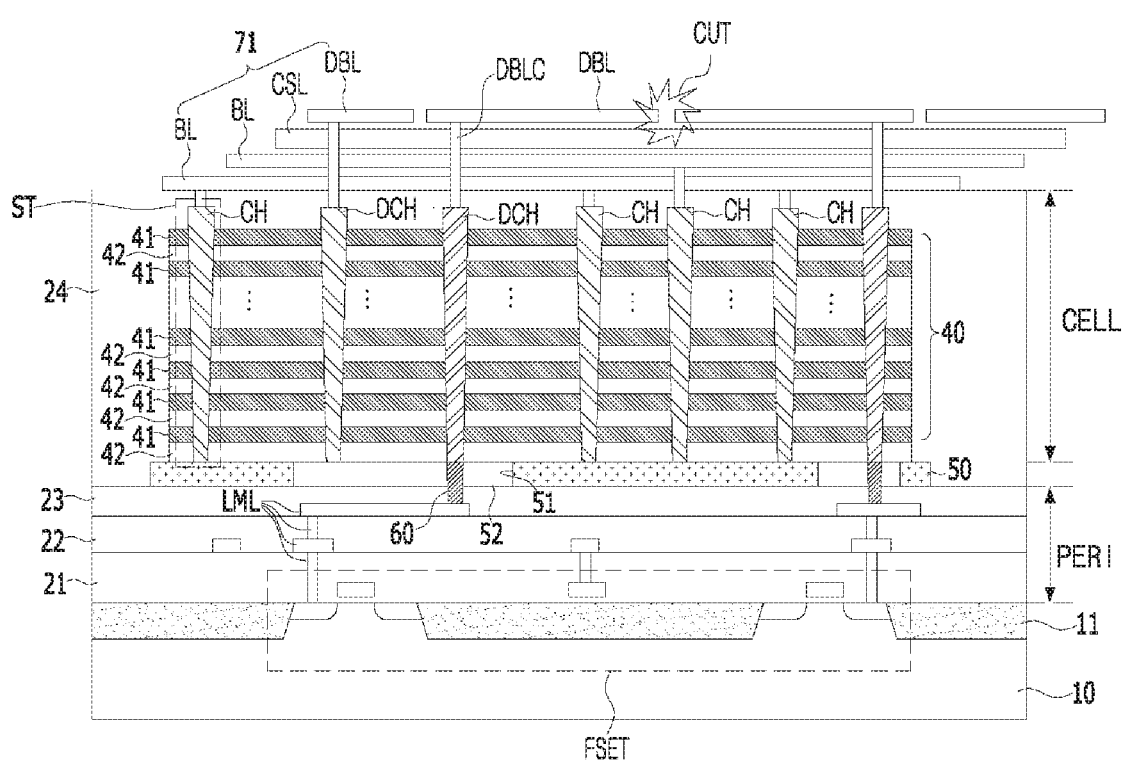
FIG. 7 is a cross-sectional view of a semiconductor memory device with a three-dimensional (3D) structure according to an embodiment of the present invention.

Referring to FIG. 7, a dummy bit line DBL may include a fuse which can be electrically cut. The dummy bit line DBL may be electrically cut to store option information or repair information. In FIG. 7, CUT indicates a portion where the dummy bit line DBL is cut.

The peripheral circuit region PERT may include a fuse control circuit FSET configured to program a fuse made up of the dummy bit line DBL and verify a program state. The fuse control circuit FSET may provide a high-level program voltage to the dummy bit line DBL.

The fuse control circuit FSET may be electrically coupled to the dummy bit line DBL through a lower wiring structure LML, a vertical contact 60, a dummy channel film DCH and a dummy bit line contact DBLC, and cut (or program) the dummy bit line DBL by applying a program voltage to the dummy bit line DBL.

When a routing path between the fuse control circuit FSET and the dummy bit line DBL is lengthened, the capacitance and resistance are increased. Then, while the influence of noise increases, a signal may be distorted during a signal transmission process, thereby causing an program error in which the dummy bit line DBL is not cut.

According to the present embodiment, since the fuse control circuit FSET formed in the peripheral circuit region PERT is electrically coupled to the dummy bit line DBL used as a fuse through the dummy channel film DCH formed through the cell structure 40, the routing path which electrically couples the fuse control circuit FSET and the dummy bit line DBL can be shortened to a smaller length than when the routing path is formed to bypass the cell structure 40. Thus, the distortion of a program voltage from the fuse control circuit FSET while transmitted to the dummy bit line DBL through the routing path can be minimized, which makes it possible to prevent a program error of the dummy bit line DBL.

Figure 8:
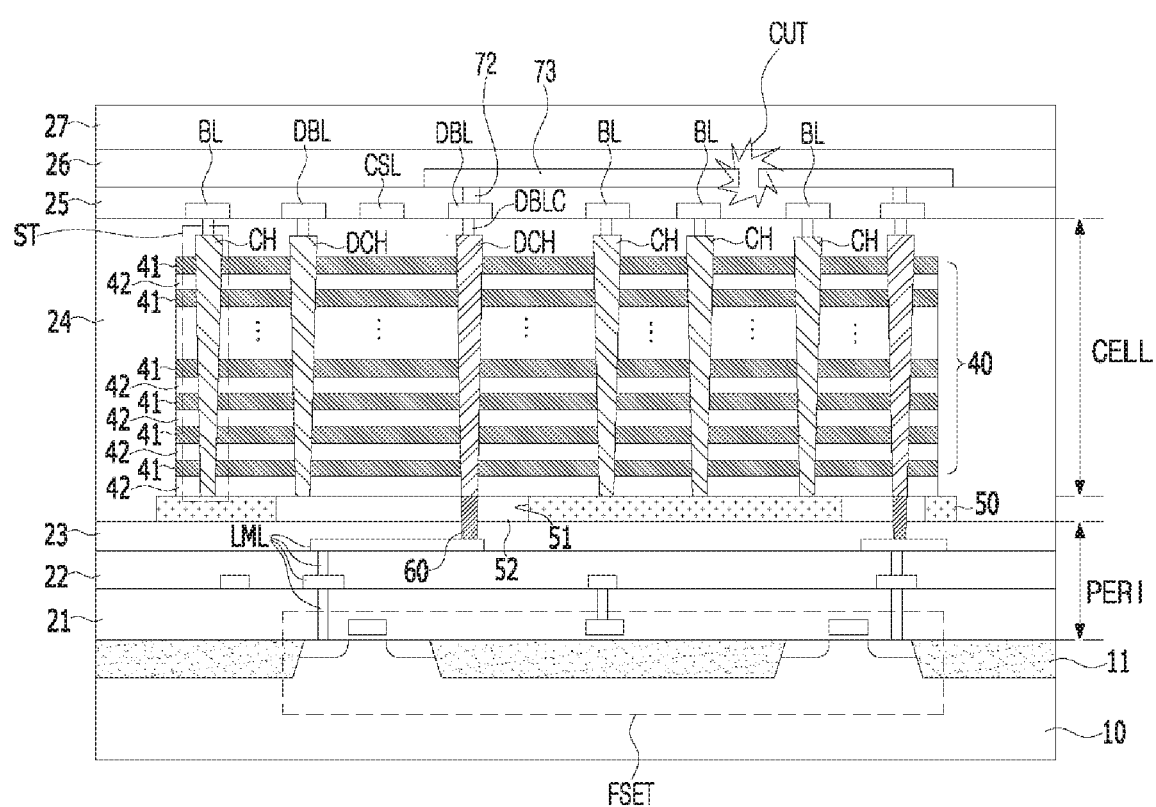
FIG. 8 is a cross-sectional view of a semiconductor memory device with a three-dimensional (3D) structure according to an embodiment of the present invention.

Referring to FIG. 8, the second upper wiring layer 73 may include a fuse which can be electrically cut. For example, the second upper wiring layer 73 may be electrically cut for storing option information or repair information. In FIG. 8, CUT indicates a portion where the second upper wiring layer 73 is cut.

The peripheral circuit region PERI may include a fuse control circuit FSET configured to program a fuse made up of the dummy bit line DBL and verify a program state. The fuse control circuit FSET may provide a high-level program voltage to the dummy bit line DBL.

The fuse control circuit FSET may be electrically coupled to the second upper wiring layer 73 through the lower wiring structure LML, the vertical contact 60, the dummy channel film DCH, the dummy bit line contact DBLC, the dummy bit line DBL and the first upper wiring contact 72, and cut (or program) the second upper wiring layer 73 by applying a program voltage to the second upper wiring layer 73.

When a routing path between the fuse control circuit FSET and the second upper wiring layer 73 is lengthened, the capacitance and resistance are increased. Then, while the influence of noise increases, a signal may be distorted during a signal transmission process, thereby causing an program error in which the second upper wiring layer 73 is not cut.

According to the present embodiment, since the fuse control circuit FSET formed in the peripheral circuit region PERI is electrically coupled to the second upper wiring layer 73 used as a fuse through the dummy channel film DCH formed through the cell structure 40, the routing path which electrically couples the fuse control circuit FSET and the second upper wiring layer 73 can be shortened to a smaller length than when the routing path is formed to bypass the cell structure 40. Thus, the distortion of a program voltage from the fuse control circuit FSET while transmitted to the second upper wiring layer 73 through the routing path can be minimized, which makes it possible to prevent a program error of the second upper wiring layer 73.

In the embodiments of FIGS. 1 and 8, the semiconductor pattern 50 under the cell structure 40 is used as a common source region, and each of the channel films CH forms an I-shaped channel.

Figure 9:
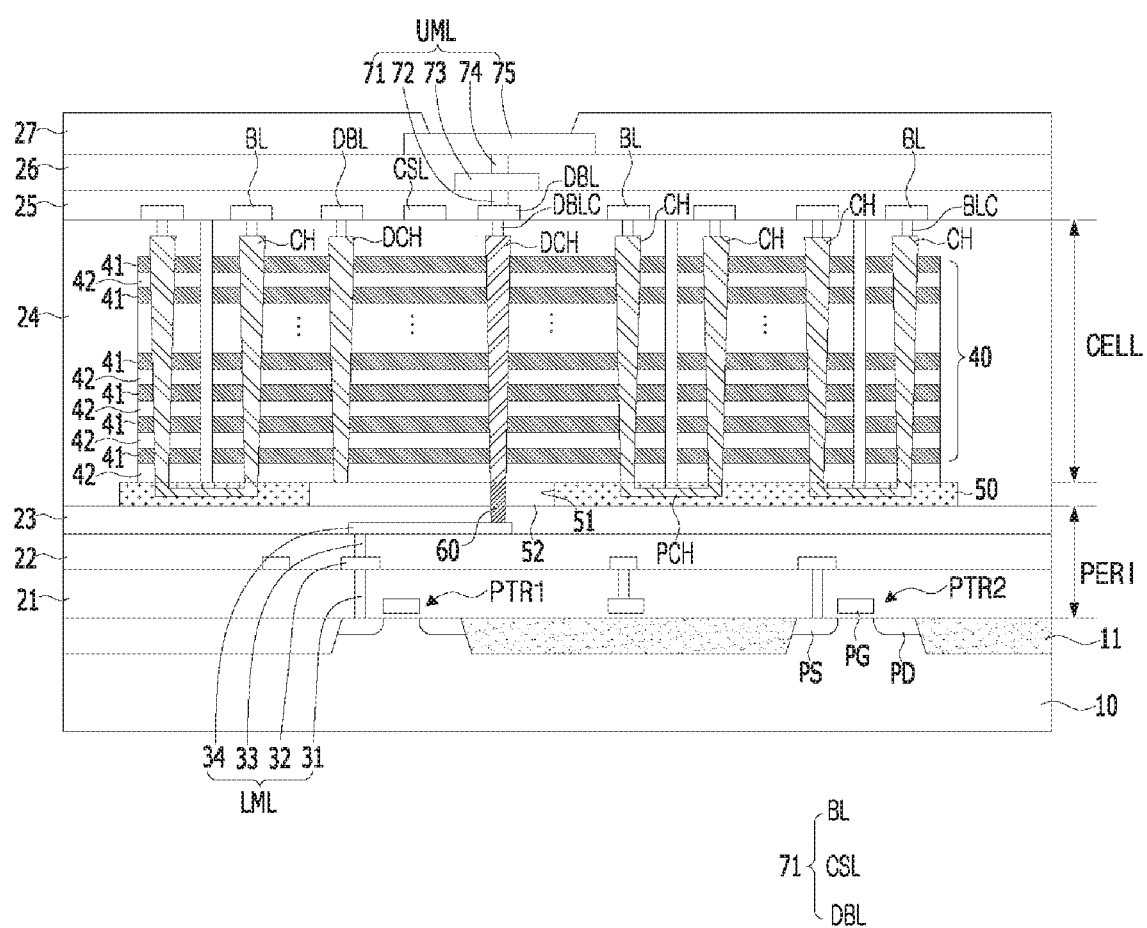
FIG. 9 is a cross-sectional view of a semiconductor memory device with a three-dimensional (3D) structure according to an embodiment of the present invention.

As illustrated in FIG. 9, however, the semiconductor pattern 50 may be used as a pipe gate electrode, and two or more channel films CH may be coupled through a pipe line channel film PCH formed in the pipe gate electrode. For example, a pair of channel films CH may be coupled through the pipe line channel film PCH, and a U-shaped channel may be provided by the pair of channel films CH and the pipe line channel film PCH.

Figure 10:
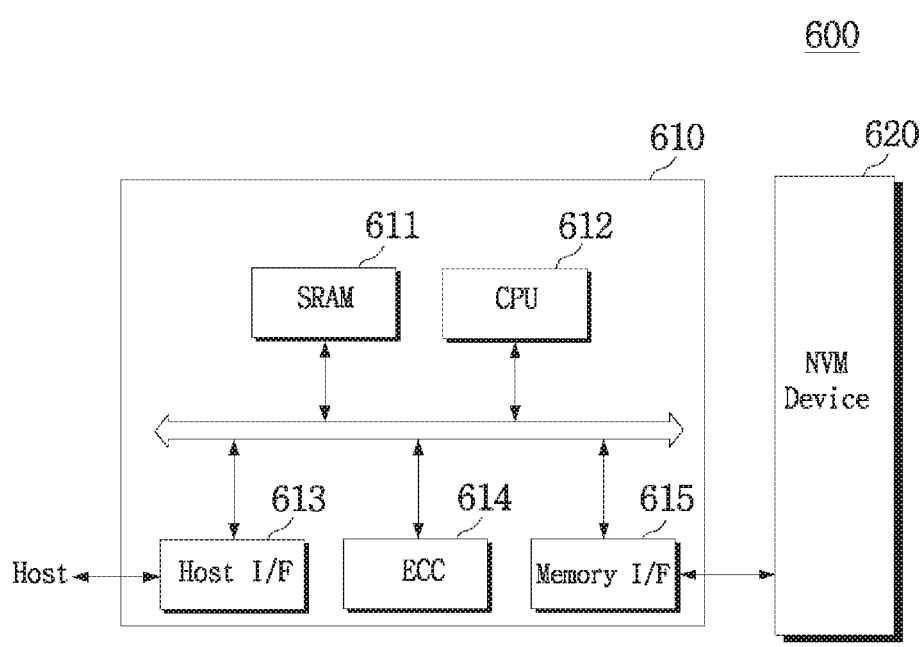
FIG. 10 is a simplified block diagram schematically illustrating a memory system including a semiconductor memory device with a three-dimensional (3D) structure, according to an embodiment of the invention.

FIG. 10 is a simplified block diagram schematically illustrating a memory system 600 including a semiconductor memory device 620 with a three-dimensional (3D) structure, according to an embodiment of the present invention.

Referring to FIG. 10, the semiconductor memory device 620 may include a semiconductor memory, according to an embodiment of the invention as described above. For example, the semiconductor memory device 620 may include the nonvolatile memory (NVM) device 620. The memory system 600 may also include a memory controller 610. The memory controller 610 may control the semiconductor memory device 620. For example, the combination of the nonvolatile memory device 620 and the memory controller 610, may be configured as a memory card or a solid state disk (SSD).

The memory controller 610 may include a static random access memory (SRAM) 611, a central processing unit (CPU) 612, a host interface (I/F) 613, an error correction code (KC) unit 614, and a memory interface 615, which are electrically coupled via an internal bus. The SRAM 611 may be used as the working memory of the CPU 612. The CPU 612 may perform general control operations for data exchange of the memory controller 610. The host interface 613 may include the data exchange protocol of a host which may be coupled with the memory system 600.

The ECC unit 614 may detect and correct an error included in the data read out from the nonvolatile memory device 620.

The memory interface 615 may interface with the nonvolatile memory device 620.

Although not shown, it should become apparent to a person skilled in the art that the memory system 600 may further be provided with a read only memory (ROM) which stores code data for interfacing with the host. The semiconductor memory device 620 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 610 may communicate with an external device (for example, the host) through one of various interface protocols such as a universal serial bus (USB) protocol, a multimedia card (MMC) protocol, a peripheral component interconnection express (PCI-E) protocol, a serial advanced technology attachment (SATA) protocol, a parallel advanced technology attachment (PATA) protocol, a small computer system interface (SCSI) protocol, an enhanced small disk interface (ESDI) protocol and an integrated device electronics (IDE) protocol and the like.

Figure 11:
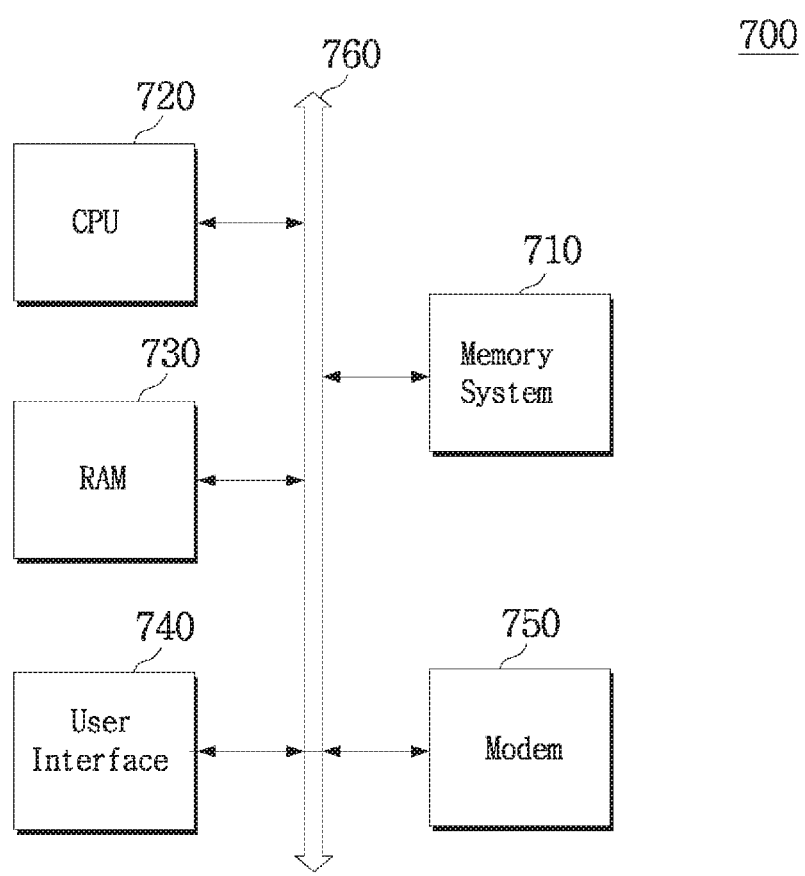
FIG. 11 is a simplified block diagram schematically illustrating a computing system including a semiconductor memory device with a three-dimensional (3D) structure, according to an embodiment of the invention.

FIG. 11 is a simplified block diagram schematically illustrating a computing system 700 including a semiconductor memory device with a three-dimensional (3D) structure, according to an embodiment of the present invention.

Referring to FIG. 11, the computing system 700 may include a memory system 710, a microprocessor (or CPU) 720, a random access memory (RAM) 730, a user interface 740, and a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a complementary metal-oxide-semiconductor (CMOS) image sensor (CIS), a mobile dynamic random access memory (DRAM), and so on. The memory system 710 may be configured, for example, as a solid state drive/disk (SSD) which uses a nonvolatile memory to store data. Also as an example, the memory system 710 may be provided as a fusion flash memory (for example, a NAND or a NOR flash memory).

The above-described embodiments may be realized by a device and a method. They may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device with a three-dimensional (3D) structure, comprising:
   a cell region arranged over a substrate, including a cell structure, wherein the cell structure includes a plurality of cell gate conductive films and a plurality of insulation films alternately stacked over the substrate;
   a peripheral circuit region arranged between the substrate and the cell region;
   an upper wiring structure arranged over the cell region;
   main channel films and dummy channel films formed through the cell structure, wherein the dummy channel films are suitable for electrically coupling the upper wiring structure and the peripheral circuit region;
   bit lines disposed over the cell structure and electrically coupled to the main channel films;
   dummy bit lines disposed over the cell structure and electrically coupled to the dummy channel films;
   an upper wiring layer disposed over the bit lines and the dummy bit lines, and electrically coupled to the dummy bit lines; and
   a common source line formed at the same layer as the bit lines and the dummy bit lines,
   wherein the main channel films and the dummy channel films extend above an uppermost film of the plurality of cell gate conductive films and the plurality of insulation films of the cell structure relative to the substrate, and
   wherein the dummy bit lines are disposed between the bit lines and the common source line,
   wherein the upper wiring structure further comprises:
   an external connection pad disposed over the upper wiring layer, and electrically coupled to the upper wiring layer.

2. The semiconductor memory device of claim 1, wherein the peripheral circuit region comprises:
   peripheral circuit elements; and
   a lower wiring structure suitable for electrically coupling the peripheral circuit elements and the dummy channel films.

3. The semiconductor memory device of claim 2, wherein the upper wiring structure is formed of a conductive material having lower resistance than the lower wiring structure.

4. The semiconductor memory device of claim 2, further comprising vertical contacts suitable for electrically coupling the dummy channel films and the lower wiring structure.

5. The semiconductor memory device of claim 4, further comprising a semiconductor pattern disposed between the peripheral circuit region and the cell region and having an opening through which the vertical contacts are passed.

6. The semiconductor memory device of claim 5, wherein the opening overlaps the dummy channel films.

7. The semiconductor memory device of claim 5, wherein the semiconductor pattern comprises a common source region electrically coupled to the main channel films.

* * * * *